United States Patent [19]

Rocchi

[11] Patent Number: 4,870,305
[45] Date of Patent: Sep. 26, 1989

[54] CIRCUIT FOR PERFORMING THE EXCLUSIVE-OR FUNCTION

[75] Inventor: Marc Rocchi, Emerainville, France

[73] Assignee: U.S. Philips Corporation, New York, N.Y.

[21] Appl. No.: 141,354

[22] Filed: Jan. 6, 1988

[30] Foreign Application Priority Data

Jan. 13, 1987 [FR] France ................................. 8700263

[51] Int. Cl.[4] ................. H03K 19/017; H03K 19/094; H03K 19/21
[52] U.S. Cl. ..................................... 307/471; 307/448; 307/451
[58] Field of Search ................. 307/443, 448, 451, 471

[56] References Cited

U.S. PATENT DOCUMENTS 4,620,117  10/1986  Fang ..................................... 307/451

FOREIGN PATENT DOCUMENTS 58-38033  3/1983  Japan .

OTHER PUBLICATIONS

I.B.M. Tech. Disc. Bul., 3/78, Balasubramanian et al.
D. Meignant et al., A 0.1–4.5 GHz, 29 mW GaAs Prescaler Operating at 125° C., 1986 IEEE Gallium–Arsenide Integrated Circuit Symposium, Grenelefe, Fla., Oct. 28–30, 1986.

*Primary Examiner*—Stanley D. Miller
*Assistant Examiner*—Margaret Rose Wambach
*Attorney, Agent, or Firm*—Thomas A. Briody; Jack E. Haken; Jack D. Slobod

[57] ABSTRACT

A circuit for performing the EXCLUSIVE-OR function of a signal A and a signal B comprises field effect transistors of the MESFET type normally cut off in the absence of a gate-source signal. The circuit also comprises loads and is integrated on a semiconductor substrate of the group III-V. A signal $\overline{A}$ which is complementary to the signal A is also applied to this circuit. The circuit is formed by a field effect transistor $T'_1$ whose gate is controlled by the signal B, whose drain receives the signal A via a load $R'_1$, and whose source receives the signal $\overline{A}$ which is complementary to the signal A. The signal representing the EXCLUSIVE-OR function ($A \oplus B$) is available at the junction of the drain of the transistor $T'_1$ and the load $R'_1$ and constitutes the output $S_1$ of the gate.

12 Claims, 2 Drawing Sheets

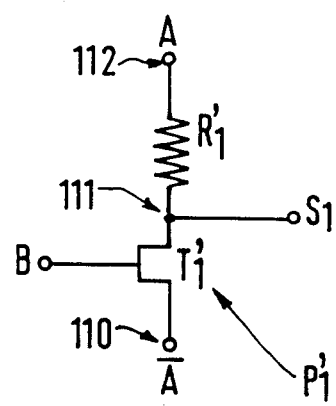
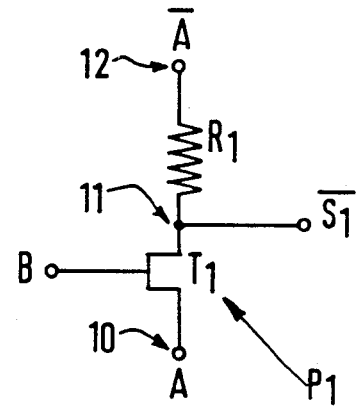
FIG.1a  FIG.1b
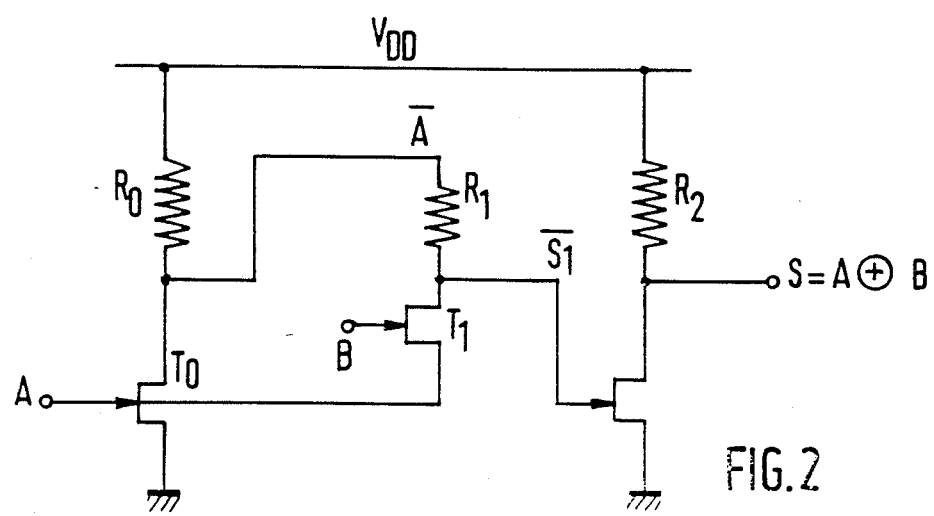
FIG.2

CIRCUIT FOR PERFORMING THE EXCLUSIVE-OR FUNCTION

BACKGROUND OF THE INVENTION

1. Field of the Invention

The invention relates to a circuit for performing the EXCLUSIVE-OR function of a signal A and B, which circuit comprises field effect transistors normally cut off in the absence of a gate-source signal and also comprises loads and is integrated on a semiconductor substrate, a signal $\overline{A}$ which is complementary to the signal A also being applied to this circuit.

The invention also relates to a circuit which performs the EXCLUSIVE-OR function of a signal A and a signal B and which generates the signals necessary for its operation.

The invention is used for the miniaturization of integrated circuits comprising logic gates of the EXCLUSIVE-OR type formed on a semiconductor substrate of a material of the group III–V, notably gallium arsenide.

2. Description of the Prior Art

An EXCLUSIVE-OR gate realized by means of field effect transistors of the MESFET type normally cut off in the absence of a gate-source signal on a gallium arsenide (Ga-As) substrate is known from a publication in "1986 IEEE gallium-arsenide integrated Circuit Symposium, Grenelefe, Fla., Oct. 28–30, 1986" entitled "A 0.1–4.5 GHz, 29 mW GaAs Prescaler operating at 125° C." by Didier MEIGNANT, Etienne DELHAYE, Marc ROCCHI.

The circuit described in the cited publication comprises six field effect transistors and three loads for realizing the EXCLUSIVE-OR gate.

The required number of elements increases to eight transistors and five loads when also providing for the internal generation of a signal complementary to one of the input signals. This necessitates two supplementary inverter stages.

SUMMARY OF THE INVENTION

Presently, further miniaturized circuits are in demand. Therefore, the present invention proposes a circuit which performs the EXCLUSIVE-OR function and which is realized in MESFET technology, using a single transistor and a single load, as well as a complete circuit which enables any required complementary input signal to be internally generated and which includes a circuit of the same construction as said EXCLUSIVE-OR circuit, which complete circuit comprises only three field effect transistors and three loads. This means an enormous saving as regards space and also a substantial reduction of the power consumption in comparison with the known state of the art EXCLUSIVE-OR gate in the technologies of semiconductors of the III–V group. A further advantage consists in that in comparison with the state of the art this novel gate does not increase the transition time between the input and the output of the circuit.

It is to be noted that the field effect transistors of the MESFET type normally cut off in the absence of a gate-source signal, and when realized on a semiconductor substrate of the group III–V, have a non-insulated gate. Due to this non-insulated gate, known circuits in silicon technology can hardly be used for simplifying the circuit for performing the EXCLUSIVE-OR function. Therefore, the circuits realized by means of MESFET are complex and necessitate the use of a large number of transistors and loads as described above.

The present invention enables this problem to be solved by means of a circuit as described above which is characterized in that it is formed by a field effect transistor $T'_1$ whose gate is controlled by the signal B, whose drain receives the signal A via a load $R'_1$, and whose source receives the signal $\overline{A}$ which is complementary to the signal A, the signal representing the EXCLUSIVE-OR function $(A \oplus B)$ being available on the junction of the drain of the transistor and the load and forming the output $S_1$ of this circuit.

In an alternative embodiment in accordance with the invention, a circuit for performing the $\overline{\text{EXCLUSIVE-OR}}$ function (complementary EXCLUSIVE-OR $= \overline{A \oplus B}$) of a signal A and a signal B, which circuit comprises field effect transistors of the MESFET type normally cut off in the absence of a gate-source signal and also comprises loads and is integrated on a semiconductor substrate of the group III–V, a signal $\overline{A}$ complementary to the signal A also being applied to this circuit, is characterized in that it is formed by a field effect transistor $T_1$ whose gate is controlled by the signal B, whose drain receives the signal $\overline{A}$ which is complementary to the signal A via a load $R_1$, and whose source receives the signal A, the signal representing the $\overline{\text{EXCLUSIVE-OR}}$ function $(\overline{A \oplus B})$ being available on the junction of the drain of the transistor and the load, which junction constitutes the output $\overline{S}_1$ of the circuit.

In an embodiment in accordance with the invention, a circuit for performing the $\overline{\text{EXCLUSIVE-OR}}$ function of a signal A and a signal B, which circuit generates the signals necessary for its operation, is characterized in that it comprises a circuit of the above type for performing the $\overline{\text{EXCLUSIVE-OR}}$ function $(\overline{A \oplus B})$, the signal $\overline{A}$ which is complementary to the signal A and which is required for this circuit being generated by a first inverter stage, the output signal of the $\overline{\text{EXCLUSIVE-OR}}$ circuit being applied to the input of a second inverter stage, the overall output of the circuit taking place on the output of the second inverter stage and representing the EXCLUSIVE-OR function $(A \oplus B)$.

In a special embodiment, the latter circuit is characterized in that each inverter stage is formed by a field effect transistor of the MESFET type normally cut off in the absence of a gate-source signal whose gate is controlled by the input signal, being A for the first inverter stage and $\overline{\text{EXCLUSIVE-OR}}$ for the second inverter stage, its source being connected to ground and its drain receiving the d.c. supply voltage via a load, the output signal, being $\overline{A}$ for the first inverter stage and EXCLUSIVE-OR for the second inverter stage, being available on the junction of the drawn and the load.

The invention will be described in detail hereinafter with reference to the accompanying diagrammatic drawings; therein

BRIEF DESCRIPTION OF THE DRAWING

FIG. 1a shows the EXCLUSIVE-OR gate in accordance with the invention and FIG. 1b shows the $\overline{\text{EXCLUSIVE-OR}}$ gate;

FIG. 2 shows the complete circuit enabling the generating of the signals necessary for the operation of the gate and including an $\overline{\text{EXCLUSIVE-OR}}$ gate.

DETAILED DESCRIPTION OF THE PREFERRED EMBODIMENTS

Figure 3:
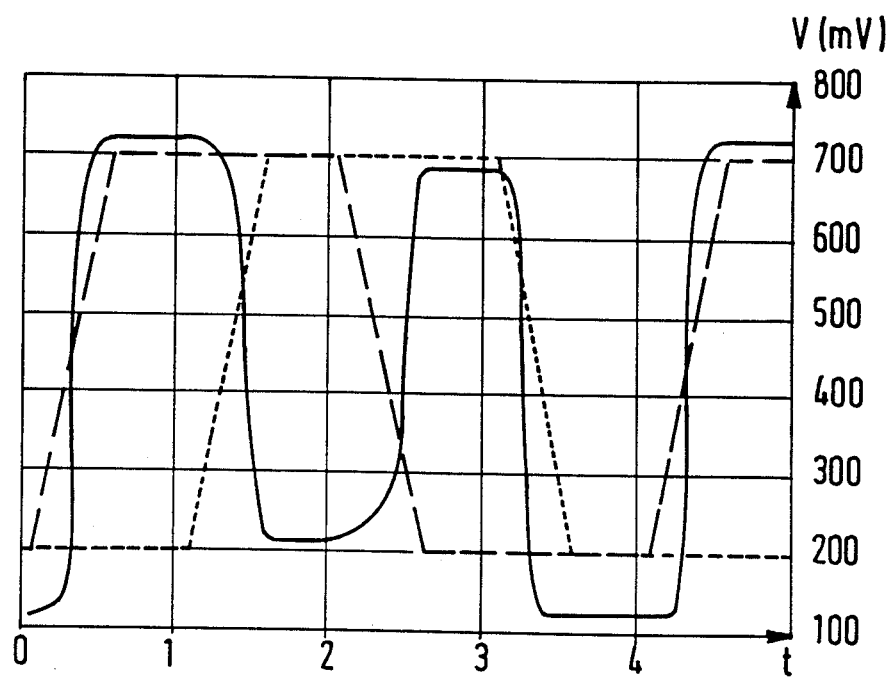
FIG. 3 shows the sequencing of the signals.

As appears from FIG. 1a, the EXCLUSIVE-OR gate $P'_1$ in accordance with the invention is formed by a field effect transistor $T'_1$ of the MESFET type normally cut off in the absence of a gate-source signal. The gate of the transistor $T'_1$ is controlled by a signal, for example B. The source of the transistor $T'_1$ is connected to a terminal 110 whereto a second signal is applied, for example the signal $\overline{A}$ which is complementary to a signal A. The drain 111 of the transistor $T'_1$ is connected to a terminal 112 which receives the signal A via a load $R'_1$. The output $S_1$ of the gate is available on the terminal 111 and is such that it transports the signal representing the EXCLUSIVE-OR function:

$S_1 = A \oplus B$.

Actually, such an EXCLUSIVE-OR gate can present the states shown in the Table 1:

TABLE I

| A | B | $S_1 = A \oplus B$ |
|---|---|---|
| 0 | 0 | 0 |
| 0 | 1 | 1 |
| 1 | 0 | 1 |
| 1 | 1 | 0 |

This is the case for the gate shown in FIG. 1a.

As appears from FIG. 1b, the circuit $P_1$ performs the $\overline{\text{EXCLUSIVE-OR}}$ function (complementary EXCLUSIVE-OR = $\overline{A \oplus B}$). The circuit $P_1$ is formed by a structure which is identical to the circuit $P'_1$ described above. It actually comprises a field effect transistor $T_1$ of the MESFET type normally cut off in the absence of a gate-source signal. The gate of the transistor $T_1$ is controlled by the signal B. The source of the transistor $T_1$ is connected to a terminal 10 which receives the signal A. The drain 11 of the transistor $T_1$ is connected to the terminal 12 which receives the signal $\overline{A}$ which is complementary to the signal A via a load $R_1$. The output $\overline{S_1}$ of this circuit is available on the terminal 11 and is such that it transports the $\overline{\text{EXCLUSIVE-OR}}$ signal:

$\overline{S_1} = \overline{A \oplus B}$

Thus, the circuit $P_1$ is similar to the circuit $P'_1$, but the signal A and its complementary $\overline{A}$ are inverted. In these circumstances, the output is also inverted.

In order to generate the signal $\overline{A}$ which is complementary to the signal A and necessary for achieving the desired function, and in order to realize an EXCLUSIVE-OR circuit having a fan-out of at least 4, the gate shown in FIG. 1b is included in the circuit shown in FIG. 2.

As appears from FIG. 2, such an EXCLUSIVE-OR circuit comprises a first inverter stage which is formed by a field effect transistor $T_0$ of the MESFET type normally cut off in the absence of a gate-source signal. The inverter transistor $T_0$ comprises a gate which is controlled by the signal A, a source which is connected to ground, and a drain which is connected to a d.c. supply voltage $V_{DD}$ via a load $R_0$. The signal $\overline{A}$ which is complementary to A is available on the junction of the drain of the inverter transistor $T_0$ and its load $R_0$ and is applied to the terminal 12 of the $\overline{\text{EXCLUSIVE-OR}}$ gate $P_1$.

On the other hand, the outputs $\overline{S_1}$ of the gate $P_1$ is applied to the gate of an inverter transistor $T_2$ whose source is connected to ground and whose drain receives the d.c. supply voltage $V_{DD}$ via a load $R_2$. The output of this second inverter stage feeds the overall output S of the circuit on which the EXCLUSIVE-OR signal $A \oplus B$ is available.

In accordance with the invention, the circuit of FIG. 2 is as fast as the known circuit, but is formed by a substantially smaller number of elements, because it comprises only three transistors and three loads instead of eight transistors and five loads.

The loads may be of a resistive type as well as be formed by field effect transistors.

FIG. 3 shows an example of the sequencing of the signals, the dotted curve representing the signal A, while the curve consisting of long strokes represents the signal B and the non-interrupted curve represents the output signal S.

It will be apparent that the output is low when A and B are both high or when A and B are both low, the output being high in the other cases.

Table 2 shows the values R of the resistances and the gate widths L of the transistors in an embodiment in which the field effect transistors are made of gallium arsenide and the d.c. supply voltage $V_{DD} = 1.2$ V the threshold voltages of the transistors $V_T = 100$ mV.

the gate lengths of the transistors $l = 0.7$ μm, the loads being of the resistive type.

TABLE II

| Transistors | L (μm) | Resistance | R (kΩ) |
|---|---|---|---|
| $T_0$ | 20 | $R_0$ | 2 |
| $T_1$ | 20 | $R_1$ | 4 |
| $T_2$ | 30 | $R_2$ | 2 |

What is claimed is:

1. A circuit for producing an output digital signal state dependent on whether the state of one of a pair of first complementary digital input signals is the same or different from the state of a second digital input signal, said circuit comprising a field effect transistor of a type which is normally cut off in the absence of a gate-source signal, an input for said second digital input signal being coupled to the gate of said transistor, an input for one of said pair of first complementary digital input signals being coupled to the source of said transistor and an input for the other of said pair of first complementary signals being coupled to the drain of said transistor via a load, said drain providing the output of said circuit.

2. The circuit of claim 1 wherein said load is resistive.

3. A circuit for performing the $\overline{\text{EXCLUSIVE-OR}}$ function of a digital input signal A and a digital input signal B, constructed of field effect transistors of a type usually cut off in the absence of a gate-source signal and loads integrated on a semiconductor substrate, said circuit comprising:

a first input for the signal A;

a second input for the signal B;

an inverter fed by said first input, said inverter having an output for an intermediate digital output signal $\overline{A}$, complementary to input signal A;

a field effect transistor, having its gate coupled to the second input, its source coupled to the first input and its drain coupled to said inverter output via a load, the drain of said transistor providing the output of said circuit.

4. The circuit of claim 3 wherein said load is resistive.

5. The circuit of claim 3 wherein said transistor and said load are respectively a first transistor and a first load and further comprising inputs for D.C. supply voltage and ground and wherein said inverter comprises a second field effect transistor having its gate coupled to the first input, its drain coupled to the D.C. supply voltage input via a second load, and its source coupled to the ground input, the drain of said second transistor being for providing the intermediate output signal $\overline{A}$.

6. The circuit of claim 5 wherein said first and second loads are resistive.

7. A circuit for performing the EXCLUSIVE-OR function of a digital input signal A and a digital input signal B constructed of field effect transistors of a type normally cut off in the absence of a gate-source signal and loads integrated on a semiconductor substrate, said circuit comprising:
  a first input for the signal A;
  a second input of the signal B;
  a first inverter fed by said first input said first inverter having an output for a first intermediate digital output signal $\overline{A}$, complementary to input signal A;
  a field effect transistor, having its gate coupled to the second input, its source coupled to the first input and its drain coupled to said first intermediate output of said first inverter, via a load, the drain of said transistor providing a second intermediate digital output signal, being the EXCLUSIVE-OR function of the digital input signals A and B; and
  a second inverter fed by said second intermediate output and having an output, being the $\overline{\text{EXCLUSIVE-OR}}$ function of the digital input signals A and B.

8. The circuit of claim 7 wherein said load is resistive.

9. The circuit of claim 7 wherein said transistor and said load are respectively a first transistor and a first load and further comprising inputs for D.C. supply voltage and ground, and wherein said first inverter comprises a second field effect transistor having its gate coupled to the first input, its drain coupled to the D.C. supply voltage input via a second load and its source coupled to the ground input, the drain of said second transistor being for providing the first intermediate output signal $\overline{A}$.

10. The circuit of claim 9 wherein said first and second loads are resistive.

11. The circuit of claim 9 wherein said second inverter comprises a third field effect transistor having its gate coupled to said second intermediate output, its drain coupled to the D.C. supply voltage input via a third load and its source coupled to the ground input, the drain of said third transistor being for providing the output of said circuit.

12. The circuit of claim 11 wherein said first, second and third loads are resistive.

* * * * *